(12) United States Patent
Philip et al.

(10) Patent No.: US 12,324,365 B2
(45) Date of Patent: Jun. 3, 2025

(54) PROXIMITY HEATER TO LOWER RRAM FORMING VOLTAGE

(71) Applicant: International Business Machines Corporation, Armonk, NY (US)

(72) Inventors: Timothy Mathew Philip, Albany, NY (US); Injo Ok, Albany, NY (US); Jin Ping Han, Yorktown Heights, NY (US); Ching-Tzu Chen, Ossining, NY (US); Kevin W. Brew, Niskayuna, NY (US)

( * ) Notice: Subject to any disclaimer, the term of this patent is extended or adjusted under 35 U.S.C. 154(b) by 313 days.

(21) Appl. No.: 18/061,312

(22) Filed: Dec. 2, 2022

(65) Prior Publication Data

US 2024/0188455 A1    Jun. 6, 2024

(51) Int. Cl.
*H10B 63/00* (2023.01)
*H10N 70/00* (2023.01)

(52) U.S. Cl.
CPC ......... *H10N 70/8613* (2023.02); *H10B 63/80* (2023.02); *H10N 70/021* (2023.02); *H10N 70/063* (2023.02); *H10N 70/841* (2023.02)

(58) Field of Classification Search
CPC ............. H10N 70/8613; H10N 70/021; H10N 70/063; H10N 70/841; H10N 70/011; H10N 70/24; H10N 70/826; H10N 70/8833; H10B 63/80
See application file for complete search history.

(56) References Cited

U.S. PATENT DOCUMENTS

| | | |
|---|---|---|
| 7,804,704 B2 | 9/2010 | Sousa |
| 8,493,772 B2 | 7/2013 | Liu |
| 8,742,387 B2 | 6/2014 | Happ et al. |
| 9,870,822 B2 | 1/2018 | Ge et al. |
| 10,535,713 B2 | 1/2020 | BrightSky et al. |
| 11,004,511 B2 | 5/2021 | Cohen et al. |
| 11,121,318 B2 | 9/2021 | Kong et al. |
| 11,476,418 B2 * | 10/2022 | Ok ..................... H10N 70/8413 |

(Continued)

FOREIGN PATENT DOCUMENTS

| | | |
|---|---|---|
| CN | 113394221 A | 9/2021 |
| TW | 202201822 A | 1/2022 |

(Continued)

OTHER PUBLICATIONS

Taiwan Patent Office, "Office Action," Oct. 4, 2024, 8 Pages, TW Application No. 112119432.

(Continued)

*Primary Examiner* — Mohammed A Bashar

(57) ABSTRACT

A computer memory device includes a bottom electrode, a top electrode, and a memory component arranged between the top electrode and the bottom electrode. The memory component is made of a dielectric solid-state material and is in direct contact with the top electrode and the bottom electrode. The computer memory device further includes a proximity heater configured to increase a temperature of a portion of the memory component. The computer memory device further includes a layer of dielectric material in direct contact with the proximity heater. The layer of dielectric material is in direct contact with one of the bottom electrode and the top electrode.

25 Claims, 10 Drawing Sheets

(56) References Cited

U.S. PATENT DOCUMENTS

| | | | | |
|---|---|---|---|---|
| 2008/0197334 | A1* | 8/2008 | Lung | H10N 70/8413 |
| | | | | 257/E45.002 |
| 2011/0272660 | A1* | 11/2011 | Wells | H10B 63/80 |
| | | | | 257/E45.001 |
| 2012/0051123 | A1* | 3/2012 | Liu | H10N 70/8828 |
| | | | | 365/163 |
| 2014/0269004 | A1 | 9/2014 | Pramanik | |
| 2017/0032837 | A1 | 2/2017 | Ge | |
| 2020/0373484 | A1* | 11/2020 | Tsai | H10B 63/80 |
| 2021/0226123 | A1 | 7/2021 | Yuan | |
| 2021/0375991 | A1 | 12/2021 | Ho et al. | |
| 2021/0408117 | A1 | 12/2021 | Wu et al. | |
| 2022/0254995 | A1 | 8/2022 | Han et al. | |
| 2024/0315153 | A1* | 9/2024 | Wu | G11C 13/0069 |

FOREIGN PATENT DOCUMENTS

| | | |
|---|---|---|
| TW | 1861897 B | 11/2024 |
| WO | 20220171405 A1 | 8/2022 |
| WO | 2024/115356 A1 | 6/2024 |

OTHER PUBLICATIONS

Butcher et al., "Hot forming to improve memory window and uniformity of low-power HfOx-based RRAMs, " 4th IEEE International Memory Workshop, 2012, 4 pgs.

Wainstein et al., "Indirectly Heated Switch as a Platform for Nanosecond Probing of Phase Transition Properties in Chalcogenides," IEEE Transactions on Electron Devices, vol. 68, No. 3, 2021, pp. 1298-1303.

International Search Report and Written Opinion dated Mar. 1, 2024, for International Application No. PCT/EP2023/083112, filed Nov. 27, 2023.

\* cited by examiner

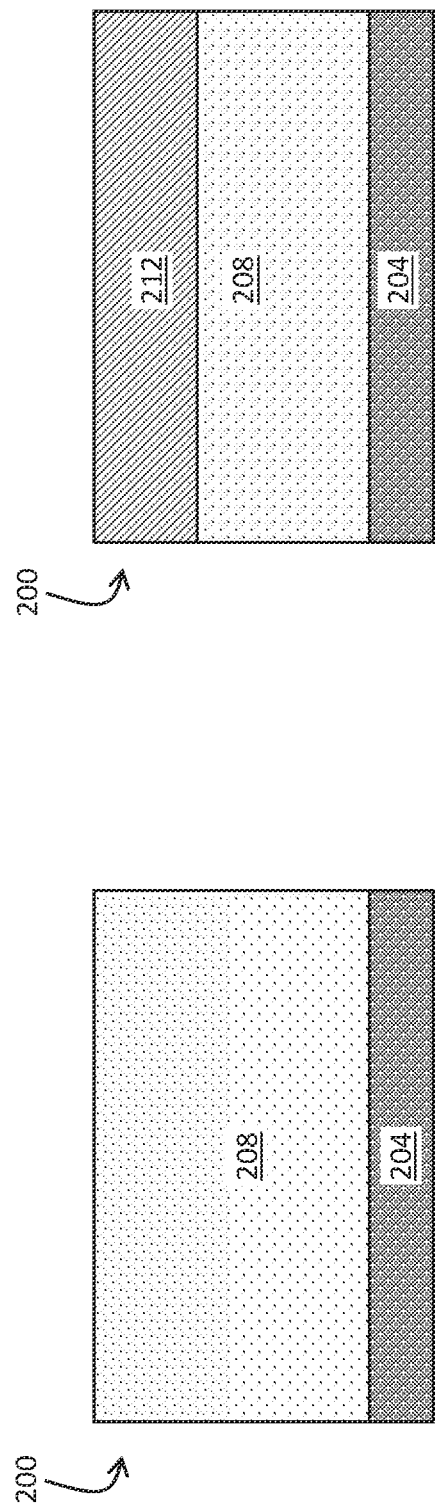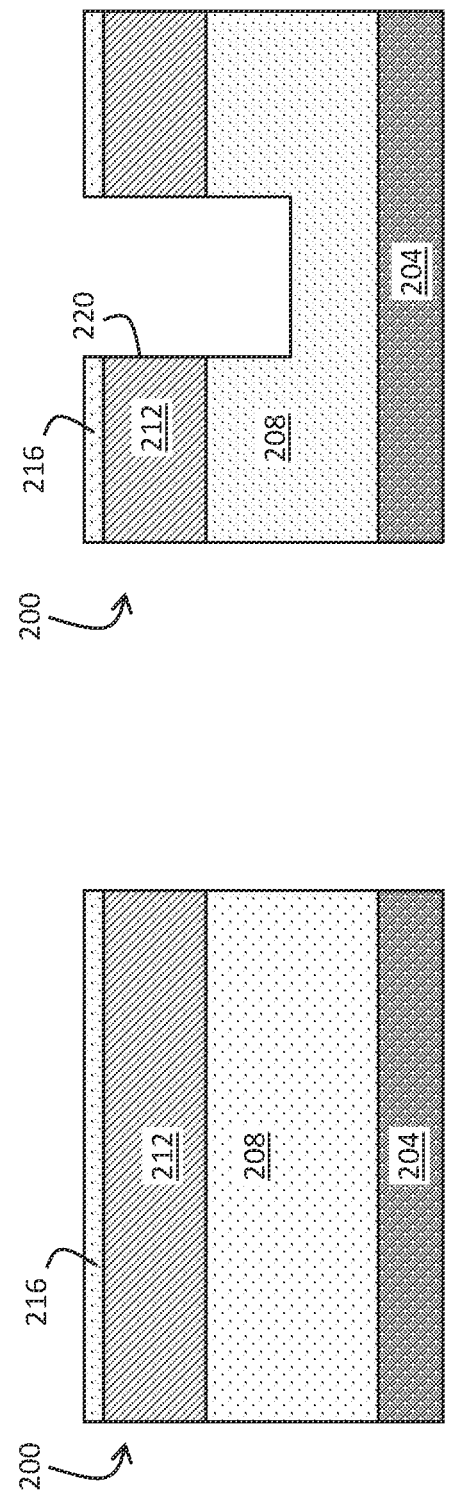

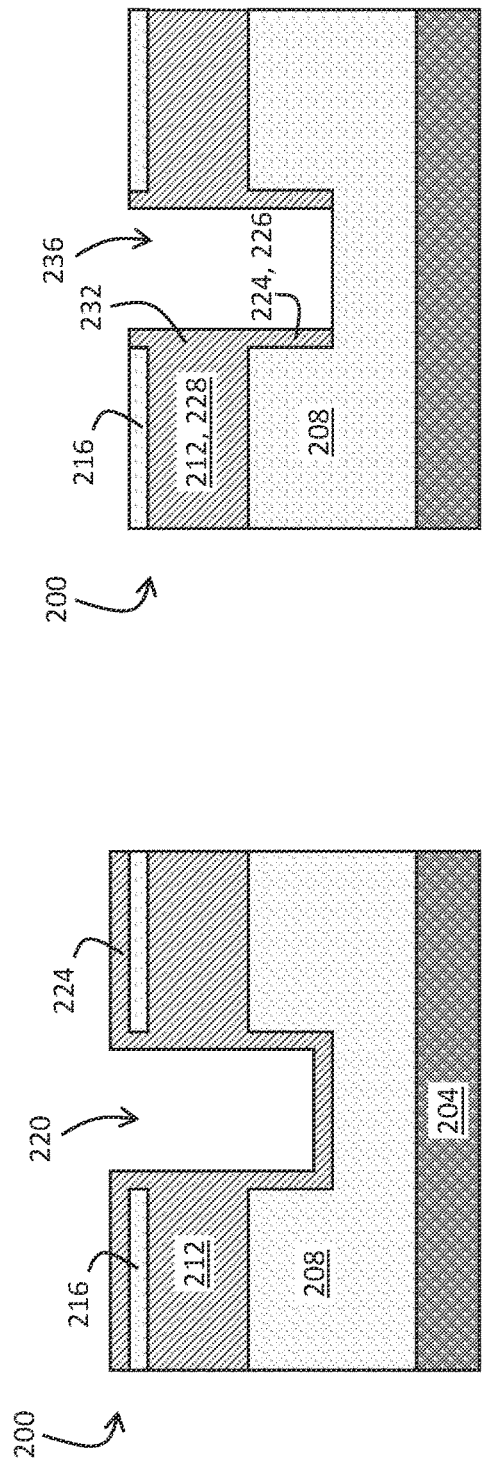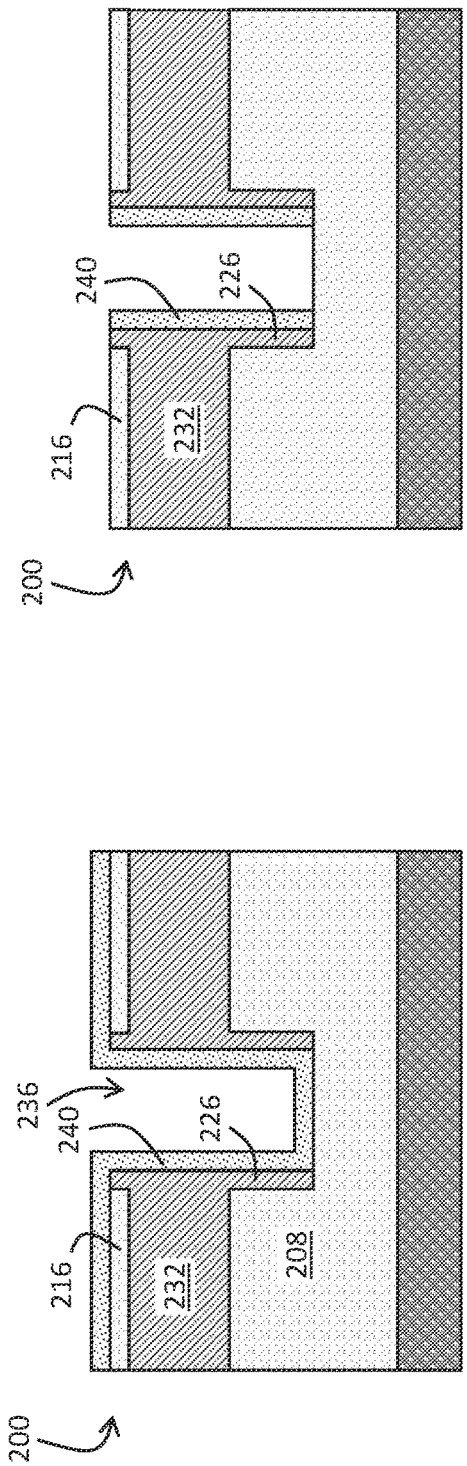

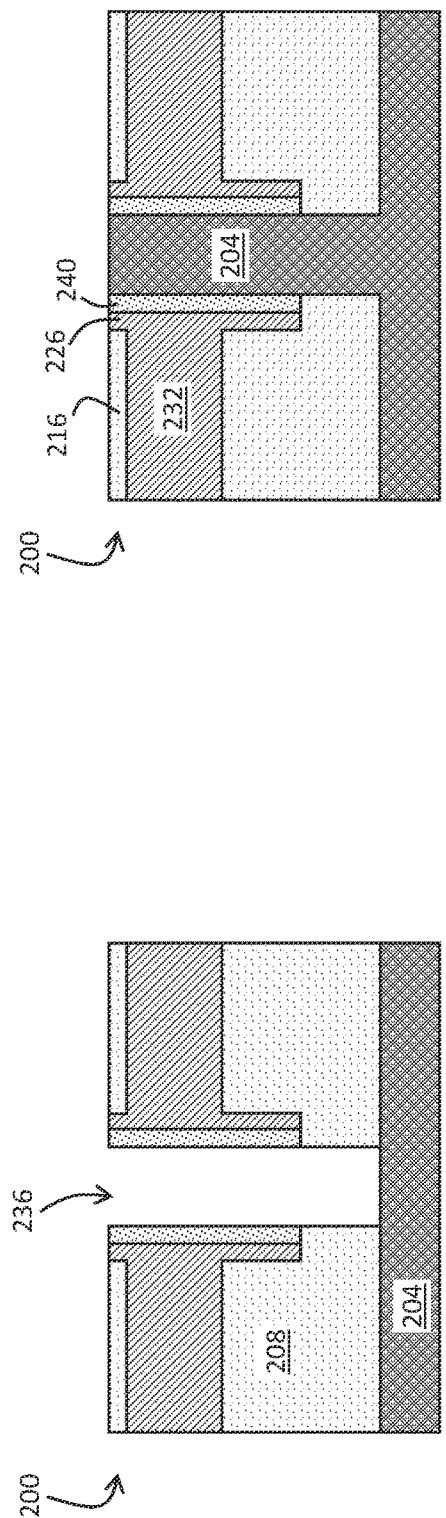
FIG. 2J
FIG. 2I
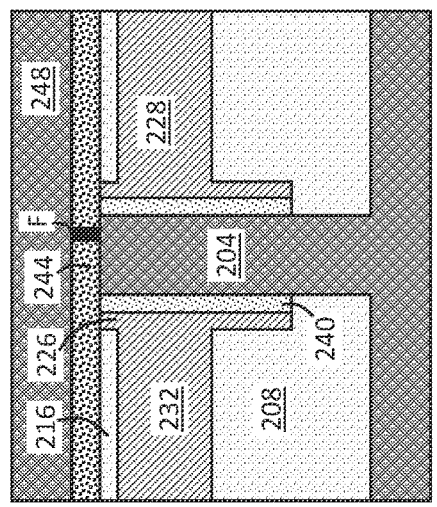
FIG. 2K

PROXIMITY HEATER TO LOWER RRAM FORMING VOLTAGE

BACKGROUND

The present disclosure relates to the electrical, electronic, and computer fields. In particular, the present disclosure relates to resistive random-access (RRAM) computer memory.

RRAM is a type of non-volatile random-access (RAM) computer memory that works by changing the electrical resistance across a dielectric solid-state material. More specifically, RRAM involves generating defects in a thin oxide layer, known as oxygen vacancies (oxide bond locations where the oxygen has been removed), which can subsequently charge and drift under an electric field. The motion of oxygen ions and vacancies in the oxide is analogous to the motion of electrons and holes in a semiconductor. The dielectric solid-state material, which is normally insulating, can be made to conduct through a filament or conduction path formed by the application of a sufficiently high voltage. In particular, during application of the sufficiently high voltage, the dielectric solid-state material will be increasingly biased until it begins to break down, creating a localized conduction path. The localized conduction path is also referred to as a filament and provides a low-resistance path through the dielectric solid-state material. Once the filament has been formed, it may be reset (broken, resulting in high resistance) or set (re-formed, resulting in lower resistance) by the application of another sufficiently high voltage. Due to this ability to switch the device between high and low resistances, the dielectric solid-state material used in an RRAM device is commonly referred to as a "switching" dielectric.

The voltage that results in the filament is applied between a top electrode and a bottom electrode arranged on opposite sides of the switching dielectric. The application of the voltage between the top and bottom electrodes that results in the generation of the filament can be referred to as "forming." Forming is a generally stochastic process. As a result, the location in the switching dielectric of the RRAM device at which the filament is formed is generally random and unpredictable.

RRAM offers some advantages relative to other types of RAM. For example, RRAM can operate at a faster timescale than phase-change memory. RRAM can have a simpler, smaller cell structure compared to magnetoresistive RAM. Compared to flash memory and racetrack memory, RRAM can be operated using a lower voltage, and hence it can be used in low-power applications. Additionally, RRAM may be scalable to smaller sizes than other types of RAM due to its reliance on the motion of oxygen atoms, which may enable scaling that is not directly tied to cell size.

However, the voltage required to form the filament during the forming operation is relatively high and presents a significant challenge in the adoption of RRAM and therefore the ability to utilize the benefits that are enabled by RRAM devices. Accordingly, it is desirable to reduce the forming voltage in order to improve the viability and applicability of RRAM devices.

One strategy for reducing the forming voltage is to increase the temperature of the switching dielectric during the forming process. Higher temperatures can enable both a reduction in the applied voltage required for forming and a reduction in the time required for forming. However, challenges remain in terms of how to achieve a higher temperature of the switching dielectric. For example, heating the entirety of the device heats the switching dielectric, but also unnecessarily heats the other elements of the device, resulting in a large amount of wasted energy. Additionally, some other elements of the device may be negatively impacted by temperature increases that are large enough to reduce the forming voltage. Accordingly, it is desirable to be able to selectively heat the switching dielectric of a memory cell of an RRAM device.

SUMMARY

Embodiments of the present disclosure include a computer memory device. The computer memory device includes a bottom electrode, a top electrode, and a memory component made of a dielectric solid-state material. The memory component is arranged between the top electrode and the bottom electrode. The memory component is in direct contact with the top electrode and the bottom electrode. The device further includes a proximity heater configured to increase a temperature of a portion of the memory component. The device further includes a layer of dielectric material in direct contact with the proximity heater. The layer of dielectric material is in direct contact with one of the bottom electrode and the top electrode.

The inclusion of a proximity heater within the device provides a structure that enables selective heating of a portion of the dielectric solid-state material of the memory component. Accordingly, such embodiments enable selective heating of the switching dielectric of a memory cell of an RRAM device.

In accordance with some embodiments of the present disclosure, the proximity heater can be arranged between the top electrode and the bottom electrode. Such embodiments further facilitate selective heating of the switching dielectric of a memory cell of an RRAM device because the memory component is also arranged between the top electrode and the bottom electrode, and therefore in close proximity to the proximity heater.

In accordance with some embodiments of the present disclosure, the proximity heater can be in direct contact with the memory component. Such embodiments further facilitate selective heating of the switching dielectric of a memory cell of an RRAM device via direct contact.

In accordance with some embodiments of the present disclosure, the proximity heater can include an opening therethrough and the bottom electrode can be arranged at least partially within the opening. Such embodiments further facilitate selective heating of the switching dielectric of a memory cell of an RRAM device by providing a structure which efficiently accommodates the proximity heater within the device.

Additional embodiments of the present disclosure include a heating device configured to increase a temperature of a portion of dielectric solid-state material of at least one resistive random-access memory component. The heating device includes a layer of heater material and a layer of dielectric material in direct contact with the layer of heater material. The layer of dielectric material is also in direct contact with one of a top electrode and a bottom electrode of the at least one resistive random-access memory component. The heating device further includes a first terminal and a second terminal configured to pass current through the layer of heater material. The first terminal and the second terminal are configured to be operated independently of terminals that operate the top and bottom electrodes.

The inclusion of the first and second terminals operable independently of terminals that operate the top and bottom electrodes enables selective heating of the dielectric solid-state material of the at least one RRAM component by enabling inclusion of the heating device within the RRAM device but separating its functionality from the top and bottom electrodes. Accordingly, such embodiments enable selective heating of the switching dielectric of a memory cell of an RRAM device.

Additional embodiments of the present disclosure include a method of forming a resistive random-access memory component. The method includes forming a bottom electrode. The method further includes forming a proximity heater separated from the bottom electrode by a dielectric spacer such that a portion of the bottom electrode extends through a first opening in the proximity heater and a second opening the dielectric spacer. The method further includes forming a memory element made of a dielectric solid-state material in direct contact with the portion of the bottom electrode. The method further includes forming a top electrode in direct contact with the memory element.

By forming the proximity heater such that a portion of the bottom electrode extends through a first opening in the proximity heater, such embodiments enable selective heating of the switching dielectric of a memory cell of an RRAM device.

Additional embodiments of the present disclosure include a method of forming a resistive random-access memory component. The method includes forming a bottom electrode. The method further includes forming a memory element made of a dielectric solid-state material in direct contact with the bottom electrode. The method further includes forming a top electrode in direct contact with the memory element. The method further includes forming a proximity heater configured to increase a temperature of at least a portion of the memory element. The proximity heater is separated from the top electrode by a dielectric spacer.

By including the formation of the proximity heater in the formation of the RRAM component, such embodiments enable selective heating of the switching dielectric of a memory cell of an RRAM device.

Additional embodiments of the present disclosure include a computer memory device including a bottom electrode, a top electrode, and a memory component made of a dielectric solid-state material. The memory component is arranged in direct contact with the top electrode and the bottom electrode. The computer memory device further includes a proximity heater arranged between the top electrode and the bottom electrode and configured to increase a temperature of a portion of the memory component. The computer memory device further includes a layer of dielectric material in direct contact with the proximity heater and in direct contact with the bottom electrode.

Such embodiments enable selective heating of the switching dielectric of a memory cell of an RRAM device because the memory component is arranged in direct contact with the top electrode and the bottom electrode, and therefore in close proximity to the proximity heater, which is arranged between the top electrode and the bottom electrode.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2A is a schematic diagram illustrating a cross-sectional view of an example computer memory device following the performance of a portion of the example method shown in FIG. 1, in accordance with embodiments of the present disclosure.

FIG. 2B is a schematic diagram illustrating a cross-sectional view of an example computer memory device following the performance of a portion of the example method shown in FIG. 1, in accordance with embodiments of the present disclosure.

FIG. 2C is a schematic diagram illustrating a cross-sectional view of an example computer memory device following the performance of a portion of the example method shown in FIG. 1, in accordance with embodiments of the present disclosure.

FIG. 2D is a schematic diagram illustrating a cross-sectional view of an example computer memory device following the performance of a portion of the example method shown in FIG. 1, in accordance with embodiments of the present disclosure.

FIG. 2E is a schematic diagram illustrating a cross-sectional view of an example computer memory device following the performance of a portion of the example method shown in FIG. 1, in accordance with embodiments of the present disclosure.

FIG. 2F is a schematic diagram illustrating a cross-sectional view of an example computer memory device following the performance of a portion of the example method shown in FIG. 1, in accordance with embodiments of the present disclosure.

FIG. 2G is a schematic diagram illustrating a cross-sectional view of an example computer memory device following the performance of a portion of the example method shown in FIG. 1, in accordance with embodiments of the present disclosure.

FIG. 2H is a schematic diagram illustrating a cross-sectional view of an example computer memory device following the performance of a portion of the example method shown in FIG. 1, in accordance with embodiments of the present disclosure.

FIG. 2I is a schematic diagram illustrating a cross-sectional view of an example computer memory device following the performance of a portion of the example method shown in FIG. 1, in accordance with embodiments of the present disclosure.

FIG. 2J is a schematic diagram illustrating a cross-sectional view of an example computer memory device following the performance of a portion of the example method shown in FIG. 1, in accordance with embodiments of the present disclosure.

FIG. 2K is a schematic diagram illustrating a cross-sectional view of an example computer memory device following the performance of a portion of the example method shown in FIG. 1, in accordance with embodiments of the present disclosure.

DETAILED DESCRIPTION

Figure 1:
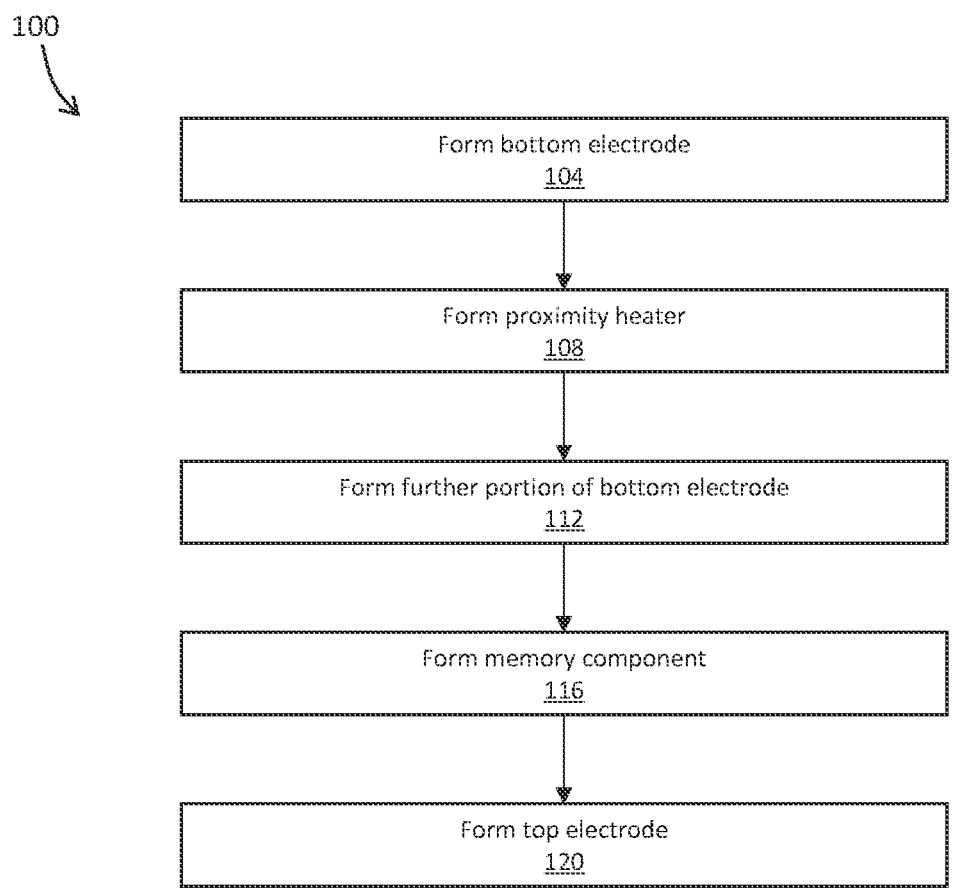
FIG. 1 illustrates a flowchart of an example method for forming a computer memory device, in accordance with embodiments of the present disclosure.

The present disclosure relates to the electrical, electronic, and computer fields. In particular, the present disclosure relates to resistive random-access (RRAM) computer memory. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Returning now to aspects of the present disclosure, as discussed above, the dielectric solid-state material, also referred to as the switching dielectric of a RRAM cell, which is normally insulating, can be made to conduct through a filament or conduction path formed by the application of a sufficiently high voltage. As further discussed above, it is desirable to be able to selectively heat the switching dielectric of a memory cell of an RRAM device. As described herein, embodiments of the present disclosure enable selective heating of the switching dielectric of a memory cell of an RRAM device.

FIG. 1 depicts a flowchart of an example method 100 of forming a computer memory device, in accordance with embodiments of the present disclosure. The method 100 begins with the performance of operation 104, wherein a bottom electrode is formed. The method 100 proceeds with the performance of operation 108, wherein a proximity heater is formed. The method 100 proceeds with the performance of operation 112, wherein a further portion of the bottom electrode is formed. The method 100 proceeds with the performance of operation 116, wherein the memory component is formed. The method 100 proceeds with the performance of operation 120, wherein the top electrode is formed. As described in further detail below, the performance of each operation of the method 100 may include the performance of a number of sub-operations. Performance of the method 100 is described in further detail below with reference to FIGS. 2A-2K.

As noted above, the performance of operation 104 includes the formation of a bottom electrode. More specifically, the bottom electrode can be formed from of a typical electrode material. Non-limiting examples of suitable electrode materials include TiN or W. The bottom electrode can be formed using known techniques that are outside of the scope of this disclosure and therefore not described in more detail herein.

Once the bottom electrode has been formed, the method 100 proceeds with the performance of operation 108, wherein a proximity heater is formed. In accordance with at least one embodiment of the present disclosure, the formation of the proximity heater further includes forming an interlayer dielectric on top of the bottom electrode. As described in further detail below, the interlayer dielectric will insulate the proximity heater from the bottom electrode.

The interlayer dielectric can be formed from a typical interlayer dielectric material. Non-limiting examples of suitable interlayer dielectric materials include $SiO_2$ or SiCOH. The interlayer dielectric can be formed using known techniques that are outside of the scope of this disclosure and therefore not described in more detail herein.

FIG. 2A illustrates an example computer memory device 200 following the performance of the above portions of the method 100. As shown, the memory device 200 includes a bottom electrode 204 and an interlayer dielectric 208 formed on top of the bottom electrode 204.

In accordance with at least one embodiment of the present disclosure, the performance of operation 108 of the method 100 further includes etching a trench in the dielectric material and depositing a heater metal therein. As described in further detail below, the heater metal will be used to form the proximity heater of the device 200 and therefore is a thermally and electrically conductive material. Accordingly, as noted above, the interlayer dielectric thermally and electrically insulates the bottom electrode from the heating metal to prevent shorting of the device. The heater metal can be a typical thermal and electrical conducting material. Non-limiting examples of suitable materials for the heater metal include TiN, W, or Cu FIG. 2B illustrates the example device 200 following the performance of the above portions of the method 100. As illustrated, a portion of the interlayer dielectric 208 has been removed to form a trench, and the trench has been filled with the heater metal 212.

In accordance with at least one embodiment of the present disclosure, the performance of operation 108 of the method 100 further includes depositing a thin interlayer dielectric layer on top of the heater metal. As described in further detail below, the thin interlayer dielectric layer will enable the formation of a collar of the proximity heater.

FIG. 2C illustrates the example device 200 following the performance of the above portions of the method 100. As illustrated, a thin interlayer dielectric layer 216 has been deposited on top of the heater metal 212. The thin interlayer dielectric layer 216 can be made of the same material as the interlayer dielectric 208. Alternatively, the thin interlayer dielectric layer 216 can be made of a different dielectric material than the interlayer dielectric 208. In either case, the thin interlayer dielectric layer 216 is made of a material that is thermally and electrically insulating.

In accordance with at least one embodiment of the present disclosure, the performance of operation 108 of the method 100 further includes etching a large via opening in the thin interlayer dielectric layer, the heater metal, and the interlayer dielectric. As described in further detail below, the via opening will enable the formation of the collar of the proximity heater. More specifically, further heater metal will be conformally deposited in the via opening so as to be in direct contact with the existing layer of heater metal. Accordingly, the via opening is formed so as to expose inner side walls of the existing layer of heater material. Additionally, to prevent shorting between the proximity heater and the bottom electrode, the further heater metal will be separated from the bottom electrode by a remaining portion of the interlayer dielectric that is formed on top of the bottom electrode. Accordingly, the via opening is formed so as to extend through the entire thickness of the thin interlayer dielectric layer and the entire thickness of the heater metal, and so as to extend through only a portion of the thickness of the interlayer dielectric.

FIG. 2D illustrates the example device 200 following the performance of the above portions of the method 100. As illustrated, a via opening 220 extends through the entire thickness of the thin interlayer dielectric layer 216 and the entire thickness of the heater metal 212, extends through only a portion of the thickness of the interlayer dielectric 208. As shown, inner side walls of the existing layer of heater metal 212 are exposed by the via opening 220. The via opening 220 does not expose the bottom electrode 204 due to the remaining thickness of the interlayer dielectric 208.

In accordance with at least one embodiment of the present disclosure, the performance of operation 108 of the method 100 further includes conformally depositing further heater metal on the device. The further heater metal will cover an uppermost surface of the thin interlayer dielectric layer and an uppermost surface of the interlayer dielectric that forms the bottom of the via opening. Additionally, the further heater metal will cover exposed vertical surfaces of the thin interlayer dielectric layer, the existing layer of heater metal, and the interlayer dielectric that form the side walls of the via opening. As a result, the further heater metal will be in direct contact with the existing layer of heater metal.

FIG. 2E illustrates the example device 200 following the performance of the above portions of the method 100. As illustrated, further heater metal 224 has been conformally deposited on the device 200 such that the further heater metal 224 covers an uppermost surface of the thin interlayer dielectric layer 216 and an uppermost surface of the interlayer dielectric 208 that forms the bottom of the via opening 220. The further heater metal 224 also covers exposed vertical surfaces of the thin interlayer dielectric layer 216, the existing layer of heater metal 212, and the interlayer dielectric 208 that form the side walls of the via opening 220. As a result, the further heater metal 224 is in direct contact with the existing layer of heater metal 212. Moreover, as a result of the conformal deposition, the further heater metal 224 is integrally formed with the existing layer of heater metal 212 such that the further heater metal 224 and heater metal 212 form a single, continuous mass.

In accordance with at least one embodiment of the present disclosure, the performance of operation 108 of the method 100 further includes performing an etch back to remove horizontal portions of the further heater metal. As a result, the remaining mass of heater metal and further heater metal will form a straight portion and a collar portion that are integrally formed with one another. Moreover, the continuous mass of heater metal and further heater metal that remains following the etch back will include an opening formed through the collar portion. Accordingly, the performance of the etch back completes the formation of the proximity heater and, therefore, the performance of operation 108.

FIG. 2F illustrates the example device 200 following the performance of the above portions of the method 100. As illustrated, an etch back has been performed to remove the horizontal portions of the further heater metal 224 that covered the exposed uppermost surfaces of the thin interlayer dielectric layer 216 and the interlayer dielectric 208. As a result, the vertical portions of the further heater metal 224 remain covering the exposed vertical surfaces of the thin interlayer dielectric layer 216, the heater metal 212, and the interlayer dielectric 208. Accordingly, the remaining further heater metal 224 forms a collar portion 226 of a proximity heater 232. Additionally, the remaining heater metal 212 forms a straight portion 228 of the proximity heater 232. As shown, the collar portion 226 is in direct contact with and is integrally formed with the straight portion 228. Thus, the proximity heater 232 is a continuous mass including the straight portion 228 and the collar portion 226. Additionally, as described in further detail below, the opening 236 that extends through the collar portion 226 of the proximity heater 232 will be used to accommodate a further portion of the bottom electrode therein.

Returning to FIG. 1, following the performance of operation 108, the method 100 proceeds with the performance of operation 112, wherein a further portion of the bottom electrode is formed. In accordance with at least one embodiment of the present disclosure, the performance of operation 112 includes forming a dielectric spacer on the device.

More specifically, in such embodiments, the dielectric spacer provides an insulative lining on the inner wall surfaces of the proximity heater. Accordingly, the dielectric spacer will insulate the further portion of the bottom electrode from the collar portion of the proximity heater. Non-limiting examples of suitable materials for the dielectric spacer include SiN, AlN, or BN. Given its function, the dielectric spacer will be made of a material that is electrically insulating, to prevent shorting between the proximity heater and the bottom electrode, and is preferably thermally conductive, to enable heat transfer from the proximity heater to the memory component. Materials such as AlN and h-BN are good candidates.

FIG. 2G illustrates the example device 200 following the performance of the above portions of the method 100. As illustrated, a dielectric spacer 240 has been conformally deposited on the device 200 in a substantially similar manner as the further heater metal, described above. Accordingly, the dielectric spacer 240 covers exposed horizontal surfaces of the thin interlayer dielectric layer 216 and the interlayer dielectric 208. The dielectric spacer 240 further covers exposed vertical surfaces within the opening 236. Accordingly, the dielectric spacer 240 covers exposed vertical surfaces of the collar portion 226 of the proximity heater 232.

In accordance with at least one embodiment of the present disclosure, the performance of operation 112 of the method 100 further includes performing an etch back of the dielectric spacer such that the dielectric spacer only remains on the vertical surfaces within the opening of the collar portion. In other words, the performance of the etch back removes the dielectric spacer from all horizontal surfaces of the device.

FIG. 2H illustrates the example device 200 following the performance of the above portions of the method 100. As illustrated, the dielectric spacer 240 has been etched back such that it only remains on the vertical surfaces of the collar portion 226 of the proximity heater 232. Notably, the horizontal uppermost surfaces of the collar portion 226 that are substantially coplanar with the uppermost surfaces of the thin interlayer dielectric layer 216 are exposed by the etch back of the dielectric spacer 240.

In accordance with at least one embodiment of the present disclosure, the performance of operation 112 of the method 100 further includes selectively etching the interlayer dielectric through the opening in the proximity heater so as to expose a portion of the uppermost surface of the bottom electrode there beneath.

FIG. 2I illustrates the example device 200 following the performance of the above portions of the method 100. As illustrated, the interlayer dielectric 208 has been selectively etched through the opening 236 so as to expose a portion of the uppermost surface of the bottom electrode 204 at the bottom of the device 200. In other words, etching the interlayer dielectric 208 extends the opening 236 downwardly to the uppermost surface of the bottom electrode 204.

In accordance with at least one embodiment of the present disclosure, the performance of operation 112 of the method 100 further includes filling the opening with further electrode material such that the further electrode material is in direct contact with the exposed portion of the bottom electrode. The further electrode material can be the same as the material used to form the bottom electrode. Accordingly, the further electrode material forms a further portion of the bottom electrode that is integrally formed with the bottom electrode. Therefore, following the performance of this portion of operation 112, the further portion of the bottom electrode and the bottom electrode collectively form a continuous mass that is the bottom electrode.

In accordance with at least some embodiments of the present disclosure, the performance of operation 112 further includes polishing the uppermost surface of the further portion of the bottom electrode such that the uppermost surface of the further portion of the bottom electrode is substantially coplanar with the uppermost surfaces of the thin interlayer dielectric layer, the collar portion of the proximity heater, and the dielectric spacer. The polishing can be achieved, for example, by performing a chemical-mechanical polishing (CMP) procedure.

FIG. 2J illustrates the example device 200 following the performance of the above portions of the method 100. As illustrated, the opening 236 (shown in FIG. 2I) has been filled with further electrode material such that the further electrode material is in direct contact with the bottom electrode 204 and becomes integrally formed with the bottom electrode 204. As a result, the completed bottom electrode 204, which includes the further electrode material, is a continuous mass extending from a lowermost surface of the device 200 through all existing layers of the device 200 and is substantially coplanar with uppermost surfaces of the thin interlayer dielectric layer 216, the collar portion 226 of the proximity heater 232, and the dielectric spacer 240.

In other words, in accordance with embodiments of the device 200, the opening 236 (shown in FIG. 2I) extends through the proximity heater 232, and the bottom electrode 204 is arranged at least partially within the opening 236. More specifically, the further portion of the bottom electrode 204 is arranged within the opening 236 such that the bottom electrode 204 is separated from the proximity heater 232 by the dielectric spacer 240.

Returning to FIG. 1, following the performance of operation 112, the method 100 proceeds with the performance of operation 116, wherein a memory component of the device is formed. In accordance with at least one embodiment of the present disclosure, the performance of operation 116 includes forming a layer of switching dielectric material on the uppermost surfaces of the device. As noted above, the switching dielectric material is a dielectric solid-state material which is normally insulating and which can be made to conduct through a filament or conduction path formed through the dielectric solid-state material by the application of a sufficiently high voltage thereto. The memory component comprises the layer of switching dielectric material. In other words, the memory component is made of a dielectric solid-state material. In accordance with at least one embodiment of the present disclosure, the memory component does not include any additional elements. In such embodiments, the memory component is a layer of dielectric solid-state material.

The memory component is in direct contact with the uppermost surfaces of the bottom electrode, the thin interlayer dielectric layer, the collar portion of the proximity heater, and the dielectric spacer. The switching dielectric material that makes up the memory component can be one that is commonly used as a switching material in RRAM cells. Non-limiting examples of suitable materials for the memory component include $HfO_x$ or $TaO_x$.

Following the performance of operation 116, the method 100 proceeds with the performance of operation 120, wherein a top electrode is formed. The top electrode is formed so as to be in direct contact with the uppermost surface of the memory component. The top electrode can be made of a known electrode material. The top electrode can be made of the same material as the bottom electrode. Alternatively, the top electrode can be made of a different material than the bottom electrode.

FIG. 2K illustrates the example device 200 following the performance of the above portions of the method 100. As illustrated, a memory component 244, which is made of a dielectric solid-state material, has been formed in direct contact with the uppermost surfaces of the bottom electrode 204, the thin interlayer dielectric layer 216, the collar portion 226 of the proximity heater 232, and the dielectric spacer 240. Accordingly, the memory component 244 is separated from the straight portion 228 of the proximity heater 232 by the thin interlayer dielectric layer 216.

As further illustrated by FIG. 2K, a top electrode 248 has been formed in direct contact with the uppermost surface of the memory component 244. Accordingly, the top electrode 248 is separated from the bottom electrode 204, the thin interlayer dielectric layer 216, the proximity heater 232, and the dielectric spacer 240 by the memory component 244.

Figure 3A:
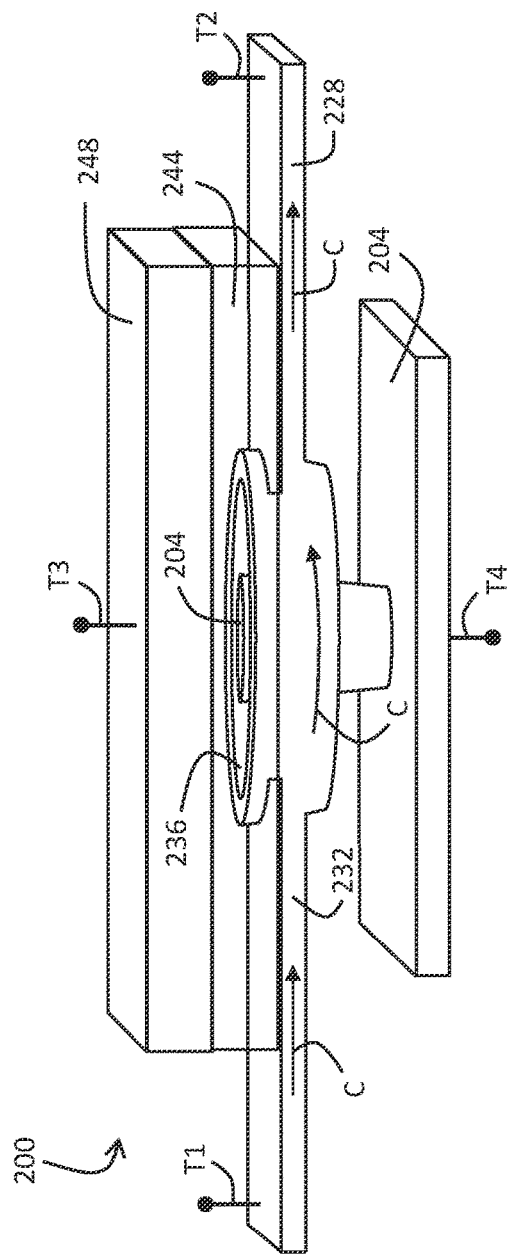
FIG. 3A is a schematic diagram illustrating a perspective view of portions of the example computer memory device shown in FIG. 2K, in accordance with embodiments of the present disclosure.
Figure 3B:
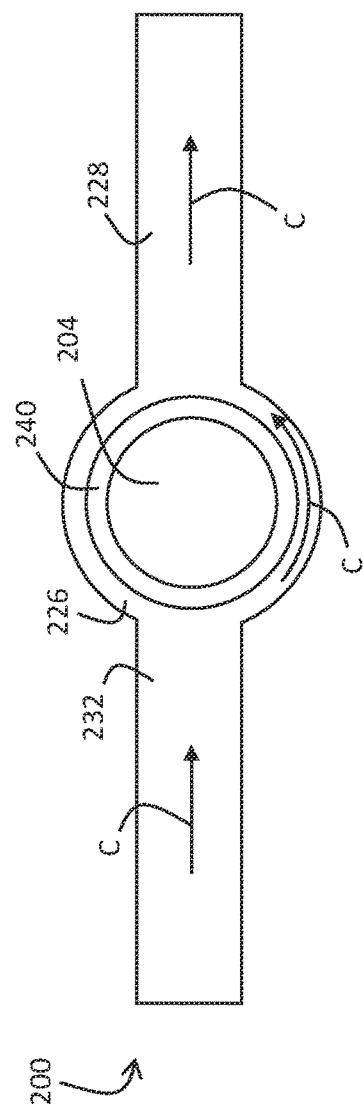
FIG. 3B is a schematic diagram illustrating a top plan view of portions of the example computer memory device shown in FIG. 2K, in accordance with embodiments of the present disclosure.

FIG. 2K illustrates the example device 200 following the completion of the performance of the method 100. FIGS. 3A and 3B illustrate a perspective view and a top plan view, respectively, of portions of the device 200 shown in FIG. 2K. Notably, in order to facilitate a clear view of the proximity heater 232, the view illustrated in FIG. 3A does not include the thin interlayer dielectric layer 216, the interlayer dielectric 208, or the dielectric spacer 240 (shown in FIG. 2K). Additionally, to further facilitate a clear view of the proximity heater 232, the memory component 244 is shown as being transparent in the view illustrated in FIG. 3A. In FIG. 3B, in order to facilitate a clear view of the proximity heater 232, only the proximity heater 232, the dielectric spacer 240, and the further portion of the bottom electrode 204 that extends through the opening 236 (shown in FIG. 2I) are shown.

As shown, the example device 200 includes the bottom electrode 204, the top electrode 248, the memory component 244, a proximity heater 232, and a dielectric spacer 240. The memory component 244 is arranged between the top electrode 248 and the bottom electrode 204 and is in direct contact with the top electrode 248 and the bottom electrode 204. Accordingly, a filament F (shown in FIG. 2K) can be formed in the memory component 244 by applying a current between the bottom electrode 204 and the top electrode 248 through the dielectric solid-state material that makes up the memory component 244. As noted above, applying the current between the bottom and top electrodes 204, 248 such that the filament F is formed is referred to as "forming" the filament F. The proximity heater 232 is configured to increase a temperature of a portion of the memory component 244. In particular, the proximity heater 232 is configured to increase the temperature of at least the portion of the dielectric solid-state material of the memory component 244 in which the filament F is formed.

Thus, the proximity heater 232 enables the dielectric solid-state material of the memory component 244 to be selectively heated. As described above, this selective heating enables a reduction in the applied voltage required for forming and a reduction in the time required for forming the filament in the dielectric solid-state material of the memory component 244. Moreover, this selective heating enables such advantages in an RRAM device without unnecessarily heating other elements of the device.

As shown in FIGS. 3A and 3B, the proximity heater 232 is configured to be operated separately from the top and bottom electrodes 248, 204. More specifically, the proximity heater 232 is electrically connected between terminals T1 and T2 such that current C between the terminals T1, T2 is conducted through the proximity heater 232. The top and bottom electrodes 248, 204 are electrically connected to terminals T3 and T4 such that current between the terminals T3, T4 is conducted through the bottom electrode, the memory component 244 and the top electrode 248. Therefore, the proximity heater 232 can be operated to increase the temperature of the memory component 244 only during the forming procedure. At all other times, read and write currents can flow between the terminals T3, T4 through the memory component 244 without operating the proximity heater 232. Accordingly, embodiments of the present disclosure enable temporally and spatially selective heating of the memory component 244 only during the forming procedure.

Notably, embodiments of the device 200 illustrated herein depict the further portion of the bottom electrode as being substantially cylindrical and the opening in the proximity heater as being substantially cylindrical as well such that the opening is substantially concentric with the further portion of the bottom electrode and such that the dielectric spacer is substantially annular to fill the space between the proximity heater and the further portion of the bottom electrode. However, it is noted that in alternative embodiments, the further portion of the bottom electrode, the opening, and the dielectric spacer could have a different shape. Moreover, in alternative embodiments, the bottom electrode and the opening could have different shapes than one another.

As shown in FIGS. 2K and 3B, the dielectric spacer 240 of the device 200 is in direct contact with the proximity heater 232 and is in direct contact with the bottom electrode 204. As noted above, the dielectric spacer 240 electrically isolates the proximity heater 232 from the bottom electrode 204, and therefore prevents shorting therebetween.

Additionally, as shown in FIG. 3A, in accordance with embodiments of the device 200, the proximity heater 232 includes the straight portion 228 and the collar portion 226 that is integrally formed with the straight portion 228. The opening 236 extends through the collar portion 226 of the proximity heater 232. However, alternative embodiments of the present disclosure may differ from the device 200 by omitting the collar portion.

Figure 4A:
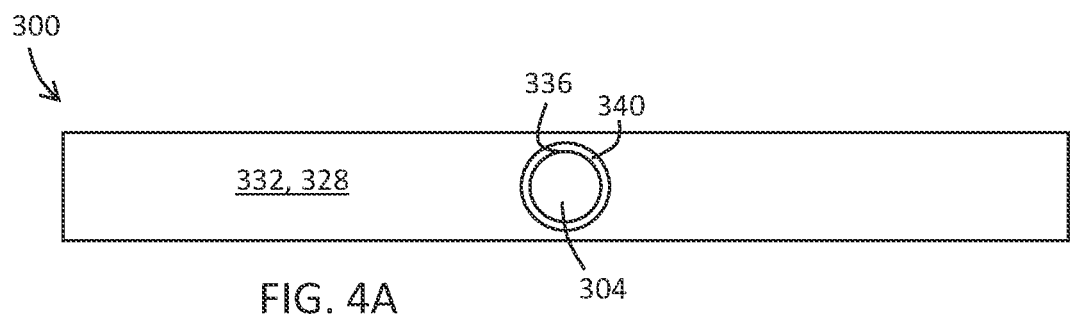
FIG. 4A is a schematic diagram illustrating a top plan view of portions of an example computer memory device, in accordance with embodiments of the present disclosure.
Figure 4B:
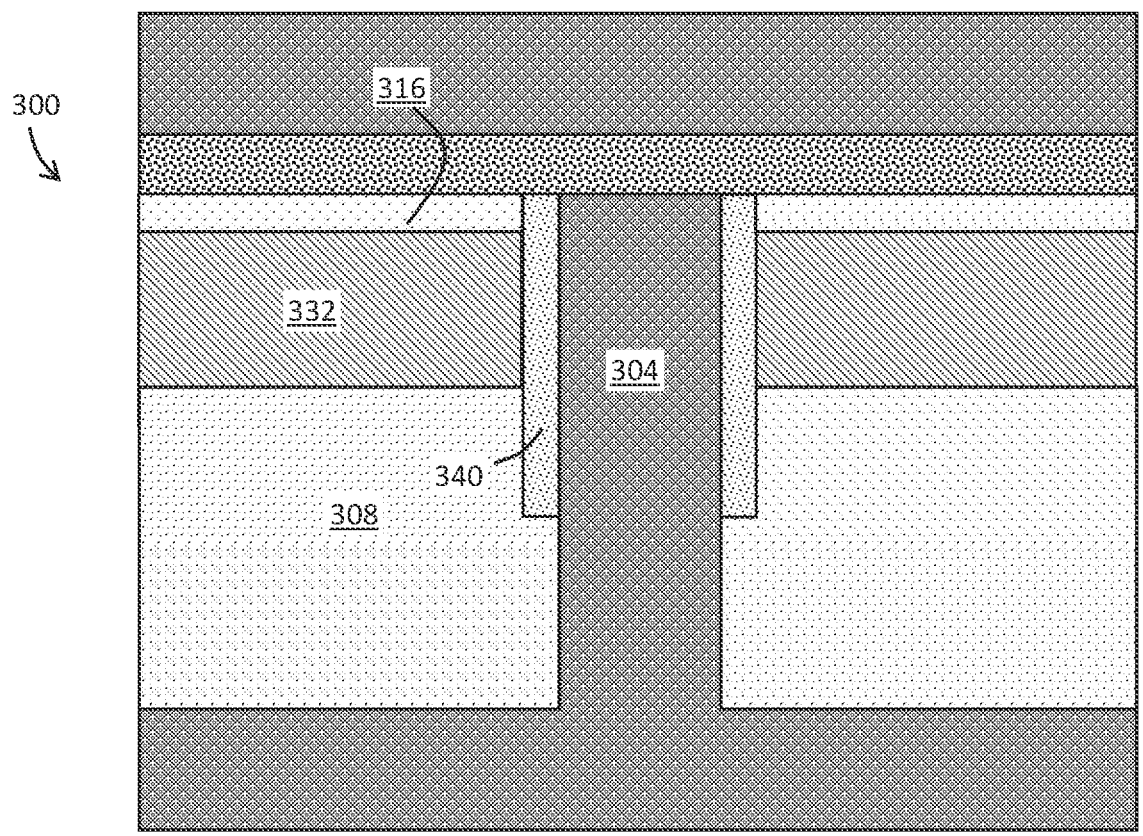
FIG. 4B is a schematic diagram illustrating a cross-sectional view of an example computer memory device, in accordance with embodiments of the present disclosure.

For example, FIGS. 4A and 4B illustrate an embodiment of a device 300 that is substantially similar in structure and function to the device 200 except that, as shown, the proximity heater 332 lacks a collar portion. In other words, the proximity heater 332 includes only a straight portion 328. Therefore, as shown in FIG. 4A, the opening 336 extends through the straight portion 328. Like the device 200, the device 300 includes a dielectric spacer 340 that separates the proximity heater 332 from the bottom electrode 304. As shown in FIG. 4B, due to the absence of the collar portion, the dielectric spacer 340 directly contacts the thin interlayer dielectric layer 316 above the proximity heater 332 and the interlayer dielectric 308 below the proximity heater 332.

Like the device 200, the device 300 can also be formed by performing the method 100 shown in FIG. 1. However, because the proximity heater of the device 300 does not include a collar portion, forming the device 300 does not include those sub-operations of the method 100 that result in the formation of the collar portion. In other words, to form the device 300, the performance of operation 108, wherein a proximity heater is formed, does not include conformally depositing further heater metal on the device or, therefore, etching back horizontal portions thereof.

Notably, as shown in FIG. 4B, the device 300 includes the thin interlayer dielectric layer 316. However, as described in further detail below, alternative embodiments of the present disclosure may differ from the device 300 by omitting the thin interlayer dielectric layer 316.

Figure 5A:
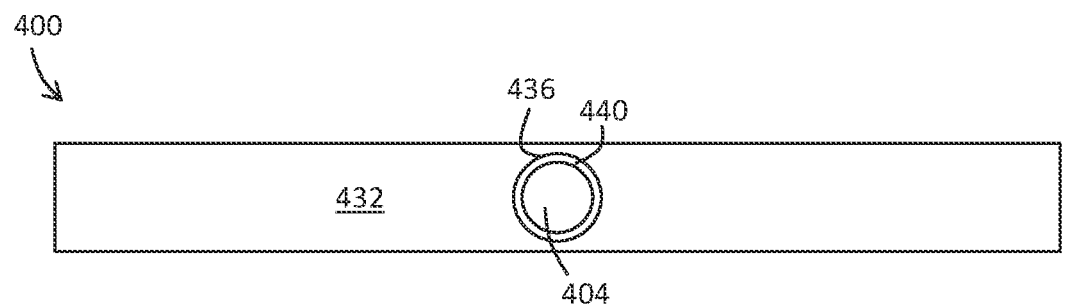
FIG. 5A is a schematic diagram illustrating a top plan view of portions of an example computer memory device shown in FIG. 4A, in accordance with embodiments of the present disclosure.
Figure 5B:
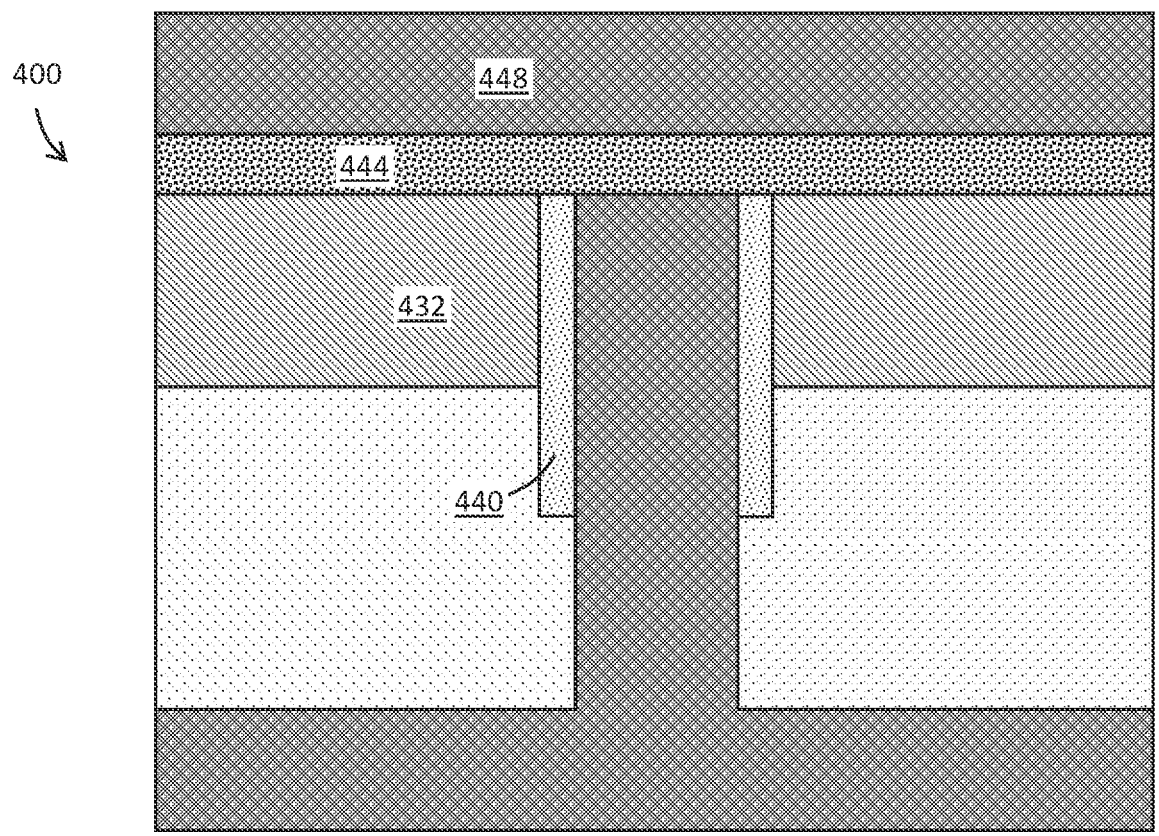
FIG. 5B is a schematic diagram illustrating a cross-sectional view of the example computer memory device shown in FIG. 5A, in accordance with embodiments of the present disclosure.

For example, FIGS. 5A and 5B illustrate an embodiment of a device 400 that is substantially similar in structure and function to the device 300 except that, as shown, the device 400 lacks a thin interlayer dielectric layer between the proximity heater 432 and the memory component 444. Because it only shows the proximity heater 432, the dielectric spacer 440, and the bottom electrode 404, the view of the device 400 shown in FIG. 5A appears to be the same as the view of the device 300 shown in FIG. 4A. However, as shown in FIG. 5B, the proximity heater 432 is in direct contact with the memory component 444 along the entirety of the proximity heater 432 except for within the opening 436 (shown in FIG. 5A).

In such embodiments, one possible way to prevent a filament from being formed in the memory component between the proximity heater 432 and the top electrode 448 when current is being conducted through the proximity heater 432 is by ensuring that the proximity heater 432 is programmed using a voltage that is close to that of the top electrode 448 such that very little field is generated between the proximity heater 432 and the top electrode 448. Additionally, in such embodiments, the material used to form the dielectric spacer 440 must have a very high breakdown field to prevent breakdown of the dielectric spacer 440 material. Alternatively, a thin electrical insulator can be formed between the proximity heater 432 and the memory component 444. For example, the thin interlayer dielectric layer that is included in other embodiments performs this function.

Like the device 300, the device 400 can also be formed by performing the method 100 shown in FIG. 1. However, because the proximity heater of the device 400 does not include a thin interlayer dielectric layer, forming the device 400 does not include those sub-operations of the method 100 that result in the formation of the thin interlayer dielectric layer. In other words, to form the device 400, the performance of operation 108, wherein a proximity heater is formed, does not include depositing a thin interlayer dielectric layer on top of the heater metal.

Returning to FIGS. 2K and 3A, in accordance with embodiments of the device 200, the proximity heater 232 is arranged between the top electrode 248 and the bottom electrode 204. Accordingly, the proximity heater 232 is arranged in close proximity to the memory component 244 to facilitate efficient selective heating of the switching dielectric of the memory component 244. More specifically, in accordance with embodiments of the device 200, the proximity heater 232 is in direct contact with the memory component 244. However, alternative embodiments of the present disclosure may differ from the device 200 by forming the device such that the proximity heater is arranged above the top electrode. In other words, in alternative embodiments of the present disclosure, the top electrode can be arranged between the proximity heater and the memory component. In such embodiments, the top electrode is also arranged between the proximity heater and the bottom electrode.

Figure 6A:
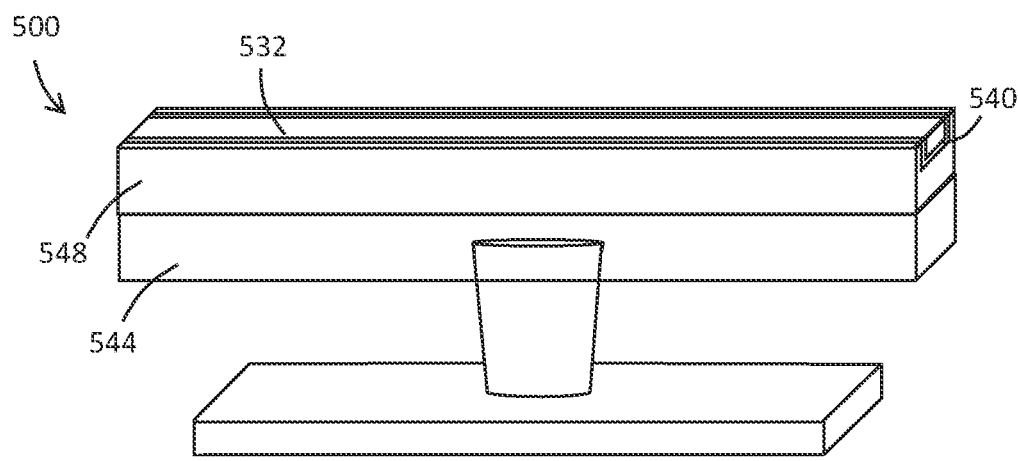
FIG. 6A is a schematic diagram illustrating a perspective view of an example computer memory device, in accordance with embodiments of the present disclosure.
Figure 6B:
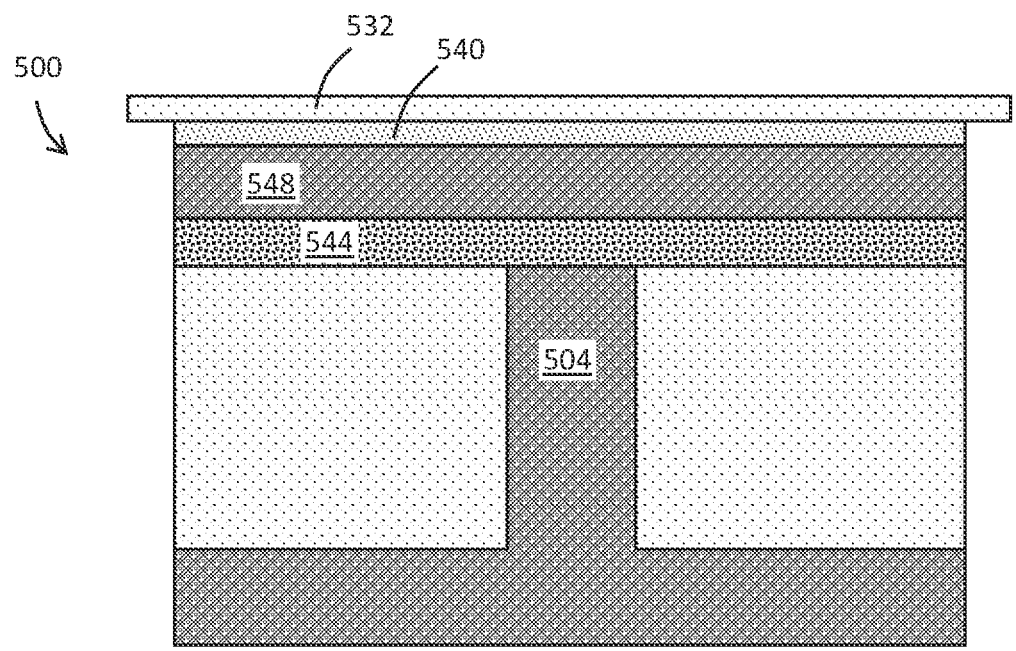
FIG. 6B is a schematic diagram illustrating a cross-sectional view of the example computer memory device shown in FIG. 6A, in accordance with embodiments of the present disclosure.

For example, FIGS. 6A and 6B illustrate an embodiment of a device 500 that is substantially similar in structure and function to the device 200 except that, as shown, the proximity heater 532 is separated from the memory component 544 by the top electrode 548. Accordingly, in such embodiments, the dielectric spacer 540 is formed in direct contact with the top electrode 548 rather than the bottom electrode 504 to prevent shorting with the top electrode 548. Because the proximity heater 532 is not being formed so as to avoid contact with the bottom electrode 504 between the bottom electrode 504 and the memory component 544, such embodiments of the proximity heater 532 need not include a collar portion or an opening.

In accordance with some such embodiments of the present disclosure, such as that illustrated by FIG. 6A, a channel is formed in the top electrode 548, the channel is lined with the dielectric spacer 540, and the proximity heater 532 is formed within the dielectric spacer 540 such that shorting is prevented between the top electrode 548 and the proximity heater 532. As shown in FIG. 6A, in accordance with such embodiments of the device 500, an uppermost surface of the proximity heater 532 is substantially coplanar with an uppermost surface of the top electrode 548.

However, in alternative embodiments, the proximity heater 532 can be formed on top of the uppermost surface of the top electrode 548 rather than embedded in a channel within the uppermost surface of the top electrode 548. In such embodiments, the uppermost surface of the proximity heater 532 will not be substantially coplanar with the uppermost surface of the electrode 548.

Figure 7:
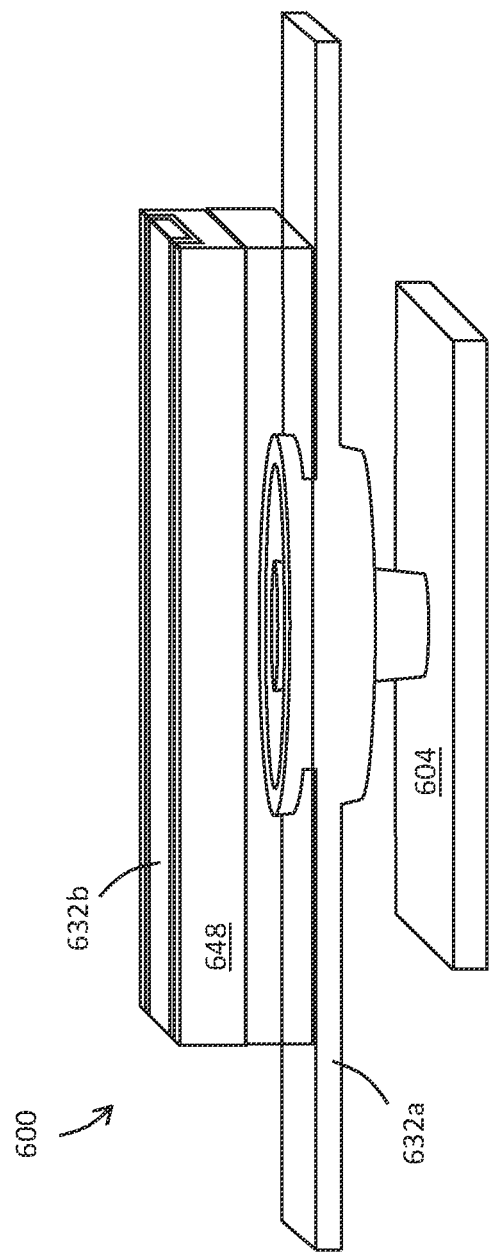
FIG. 7 is a schematic diagram illustrating a perspective view of portions of an example computer memory device, in accordance with embodiments of the present disclosure.

In accordance with some embodiments of the present disclosure, a device may also include multiple proximity heaters configured and arranged to increase the temperature of the same portion of the dielectric solid-state material of the memory component. For example, FIG. 7 illustrates a device 600 including a first proximity heater arranged 632a arranged between the top electrode 648 and the bottom electrode 604 (like the proximity heater 232 of the device 200) and a second proximity heater 632b arranged above the top electrode 648 (like the proximity heater 532 of the device 500). In other words, the top electrode 648 is arranged between the first proximity heater 632a and the second proximity heater 632b.

Figure 8:
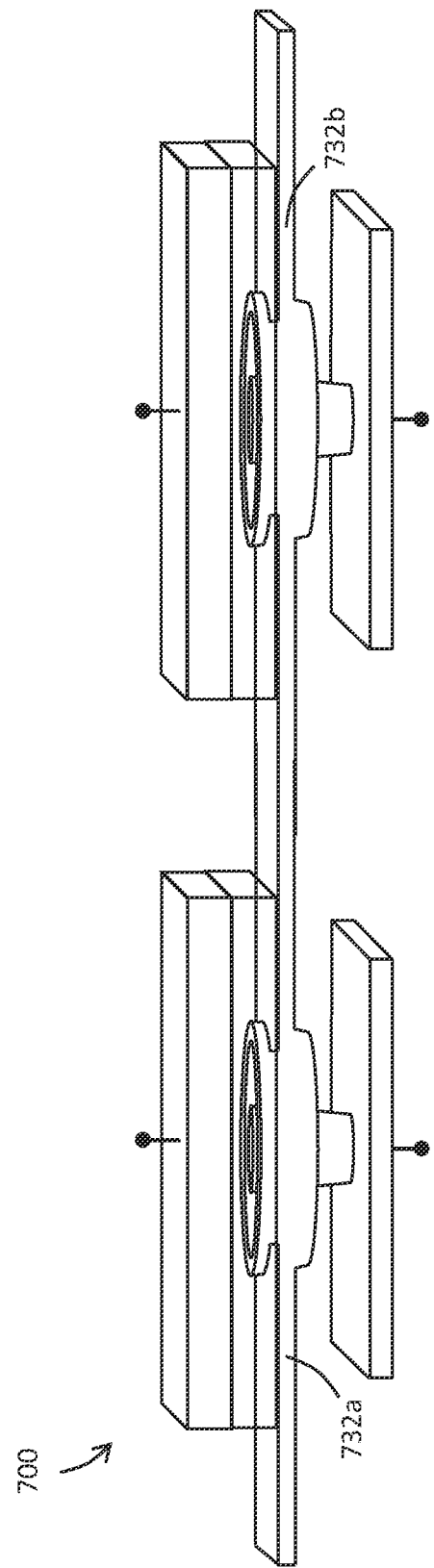
FIG. 8 is a schematic diagram illustrating a perspective view of portions of an example computer memory device, in accordance with embodiments of the present disclosure.

In accordance with some embodiments of the present disclosure, a device may include multiple proximity heaters configured to increase the temperature of different portions of a memory component or different portions of different memory components. In accordance with some embodiments, the multiple proximity heaters can be arranged in series with one another. Therefore, in accordance with some embodiments, the multiple proximity heaters can be operated at substantially the same time. For example, FIG. 8 illustrates a device 700 including a first proximity heater 732a and a second proximity heater 732b. Each of the proximity heaters 732 shown in FIG. 8 is substantially similar to the proximity heater 232 of the device 200. However, in alternative embodiments, each proximity heater could be substantially similar to that of any of the devices disclosed herein.

In addition to embodiments described above, other embodiments having fewer operational steps, more operational steps, or different operational steps are contemplated.

Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A computer memory device comprising:
    a bottom electrode;
    a top electrode;
    a memory component made of a dielectric solid-state material, the memory component arranged between the top electrode and the bottom electrode and in direct contact with the top electrode and the bottom electrode;
    a proximity heater configured to increase a temperature of a portion of the memory component; and
    a layer of dielectric material in direct contact with the proximity heater, wherein the layer of dielectric material is in direct contact with one of the bottom electrode and the top electrode, wherein the layer of dielectric material is located between the proximity heater and one of the bottom electrode and the top electrode.

2. The computer memory device of claim 1, wherein:
    the proximity heater is arranged between the top electrode and the bottom electrode.

3. The computer memory device of claim 2, wherein:
    the proximity heater is in direct contact with the memory component.

4. The computer memory device of claim 2, wherein:
    the proximity heater includes an opening therethrough; and the bottom electrode is arranged at least partially within the opening.

5. The computer memory device of claim 4, wherein:
the proximity heater includes a straight portion and a collar portion that is integrally formed with the straight portion; and
the opening extends through the collar portion.

6. The computer memory device of claim 1, further comprising:
a further proximity heater configured to increase the temperature of the portion of the memory component; and
a further layer of dielectric material in direct contact with the further proximity heater, wherein:
the further layer of dielectric material is in direct contact with the other one of the bottom electrode and the top electrode.

7. The computer memory device of claim 6, wherein:
the proximity heater is arranged between the top electrode and the bottom electrode; and
the top electrode is arranged between the proximity heater and the further proximity heater.

8. The computer memory device of claim 1, wherein:
the top electrode is arranged between the proximity heater and the bottom electrode.

9. The computer memory device of claim 8, wherein:
the top electrode includes a channel formed therein; and
the proximity heater is arranged at least partially within the channel.

10. The computer memory device of claim 9, wherein:
the layer of dielectric material is arranged within the channel such that the layer of dielectric material separates the proximity heater from the top electrode.

11. The computer memory device of claim 10, wherein:
an uppermost surface of the proximity heater is substantially coplanar with an uppermost surface of the top electrode.

12. The computer memory device of claim 1, further comprising:
a further memory component, wherein:
the proximity heater is configured to increase a temperature of a portion of the further memory component.

13. A heating device configured to increase a temperature of a portion of dielectric solid-state material of at least one resistive random-access memory component, the heating device comprising:
layer of heater material;
a layer of dielectric material in direct contact with the layer of heater material, the layer of dielectric material in direct contact with one of a top electrode and a bottom electrode of the at least one resistive random-access memory component, wherein the layer of dielectric material is located between the layer of heater material and one of the bottom electrode and the top electrode; and
a first terminal and a second terminal configured to pass current through the layer of heater material, wherein the first terminal and the second terminal are configured to be operated independently of terminals that operate the top and bottom electrodes.

14. The heating device of claim 13, wherein:
the layer of heater material includes an opening therethrough, and
the opening is configured to receive a portion of the bottom electrode therein such that the layer of heater material is not in direct contact with the portion of the bottom electrode.

15. The heating device of claim 14, wherein:
the layer of heater material includes a straight portion and a collar portion integrally formed with the straight portion, and
the opening is formed through the collar portion.

16. The heating device of claim 13, wherein:
the layer of heater material includes an uppermost surface that is substantially coplanar with an uppermost surface of the top electrode.

17. The heating device of claim 13, wherein:
the layer of dielectric material is in direct contact with one of a further top electrode and a further bottom electrode of at least one further resistive random-access memory component.

18. The heating device of claim 17, wherein:
the layer of heater material includes an opening therethrough and a further opening therethrough,
the opening is configured to receive a portion of the bottom electrode therein such that the layer of heater material is not in direct contact with the portion of the bottom electrode, and
the further opening is configured to receive a portion of the further bottom electrode therein such that the layer of heater material is not in direct contact with the portion of the further bottom electrode.

19. A method of forming a resistive random-access memory component, the method comprising:
forming a bottom electrode;
forming a proximity heater separated from the bottom electrode by a dielectric spacer such that a portion of the bottom electrode extends through a first opening in the proximity heater and a second opening the dielectric spacer;
forming a memory element made of a dielectric solid-state material in direct contact with the portion of the bottom electrode; and
forming a top electrode in direct contact with the memory element.

20. The method of claim 19, wherein:
forming the proximity heater includes:
forming a layer of heater material separated from a further portion of the bottom electrode by an interlayer dielectric; and
forming the first opening through the layer of heater material and the interlayer dielectric so as to expose an uppermost surface of the further portion of the bottom electrode; and
the portion of the bottom electrode is formed in direct contact with the uppermost surface of the further portion of the bottom electrode.

21. The method of claim 20, wherein:
forming the proximity heater further includes forming a collar of the heater material in direct contact with the layer of heater material such that the collar lines the first opening.

22. A method of forming a resistive random-access memory component, the method comprising:
forming a bottom electrode;
forming a memory element made of a dielectric solid-state material in direct contact with the bottom electrode;
forming a top electrode in direct contact with the memory element; and forming a proximity heater configured to increase a temperature of at least a portion of the memory element, the proximity heater separated from the top electrode by a dielectric spacer wherein the dielectric spacer is located between the proximity heater and the top electrode.

23. The method of claim 22, wherein:

forming the top electrode includes forming a channel in an uppermost surface of the top electrode; and forming the proximity heater includes forming the proximity heater within the channel.

24. The method of claim 23, wherein:

forming the proximity heater further includes forming the proximity heater such that an uppermost surface of the proximity heater is substantially coplanar with the uppermost surface of the top electrode.

25. A computer memory device comprising:

a bottom electrode;

a top electrode;

a memory component made of a dielectric solid-state material, the memory component arranged in direct contact with the top electrode and the bottom electrode;

a proximity heater arranged between the top electrode and the bottom electrode and configured to increase a temperature of a portion of the memory component; and a layer of dielectric material in direct contact with the proximity heater and in direct contact with the bottom electrode, wherein the layer of dielectric material is located between the proximity heater and the bottom electrode.

* * * * *